United States Patent
McDowell

(10) Patent No.: US 6,674,331 B2
(45) Date of Patent: Jan. 6, 2004

(54) METHOD AND APPARATUS FOR SIMPLIFIED TUNING OF A TWO-POINT MODULATED PLL

(75) Inventor: Richard L. McDowell, Chalfont, PA (US)

(73) Assignee: Agere Systems, Inc., Allentown, PA (US)

( * ) Notice: Subject to any disclaimer, the term of this patent is extended or adjusted under 35 U.S.C. 154(b) by 17 days.

(21) Appl. No.: 09/986,669

(22) Filed: Nov. 9, 2001

(65) Prior Publication Data

US 2003/0090328 A1 May 15, 2003

(51) Int. Cl.[7] .................................................. H03L 7/00
(52) U.S. Cl. ............................ 331/16; 331/23; 331/183; 332/128; 455/260
(58) Field of Search ................................ 331/16, 23, 183; 332/103, 107, 127, 128; 455/260, 264

(56) References Cited

U.S. PATENT DOCUMENTS

| | | | | |
|---|---|---|---|---|
| 4,052,672 A | * | 10/1977 | Enderby et al. | 332/144 |
| 4,242,649 A | * | 12/1980 | Washburn, Jr. | 332/128 |
| 4,573,024 A | | 2/1986 | Carlqvist | |
| 4,743,867 A | * | 5/1988 | Smith | 332/127 |
| 4,755,774 A | * | 7/1988 | Heck | 332/123 |
| 4,866,404 A | * | 9/1989 | Vandegraaf | 332/127 |
| 4,942,374 A | * | 7/1990 | Sai | 332/124 |
| 5,130,676 A | | 7/1992 | Mutz | |
| 5,412,353 A | * | 5/1995 | Chaplik et al. | 332/127 |
| 5,729,182 A | * | 3/1998 | Fousset et al. | 74/572 |
| 5,831,482 A | | 11/1998 | Salvi et al. | |
| 5,834,987 A | * | 11/1998 | Dent | 332/127 |
| 5,955,928 A | | 9/1999 | Smith et al. | |
| 5,983,077 A | * | 11/1999 | Dent | 716/6 |
| 5,986,512 A | * | 11/1999 | Eriksson | 331/16 |
| 6,127,896 A | | 10/2000 | Burzio | |
| 6,133,797 A | | 10/2000 | Lovelace et al. | |
| 6,172,579 B1 | * | 1/2001 | Dacus et al. | 332/128 |
| 6,175,282 B1 | | 1/2001 | Yasuda | |
| 6,236,689 B1 | | 5/2001 | Bech-Andersen | |

OTHER PUBLICATIONS

Chapter Nine—Phaselocked Modulators and Demodulators, *Phaselock Techniques,* Second Edition, Floyd M. Gardner, Ph.D., 1979, pp 165–167.

* cited by examiner

Primary Examiner—Robert Pascal
Assistant Examiner—Kimberly E Glenn
(74) Attorney, Agent, or Firm—Dickstein Shapiro Morin & Oshinsky LLP

(57) ABSTRACT

A method and apparatus are disclosed for tuning a voltage controlled oscillator (VCO) having two point modulation used in a phase lock loop modulation system. A loop correction voltage applied to a first modulation input of the VCO when a first modulation signal, e.g., +1, is applied to a second modulation input of the VCO is compared to a loop correction voltage applied to the first modulation input when a second modulation signal, e.g., −1, is applied to the second modulation input of the VCO. The comparison produces a correction signal used to adjust the signal level of at least one of the signals, e.g., the second modulation input signal, applied to the two modulation inputs of the VCO.

39 Claims, 9 Drawing Sheets

METHOD AND APPARATUS FOR SIMPLIFIED TUNING OF A TWO-POINT MODULATED PLL

FIELD OF THE INVENTION

The present invention relates to a method and apparatus for tuning a voltage controlled oscillator (VCO) within a two-point modulated phase lock loop (PLL) system.

BACKGROUND OF THE INVENTION

Phase lock loop (PLL) modulated transmission systems are known in which a carrier frequency, set by a VCO as the center frequency of the loop, can be modulated by applying a signal to a single point in the loop.

Single point modulation circuits modulate the VCO by connecting the modulating signal to one side of the loop filter or the other. With the pre-loop filter connection circuit, the modulating signal is low-pass filtered by the loop as it is modulated onto the carrier. Thus components of the modulating signal that are higher than the loop bandwidth will be suppressed. Unless there is no significant energy in the modulating signal above the loop bandwidth, the signal will suffer some loss (distortion) during the modulation.

With the post-loop filter correction circuit, the modulating signal is high-pass filtered by the loop as it is modulated onto the carrier. Thus components of the modulating signal that are lower than the loop bandwidth will be suppressed. The PLL output signal will suffer some loss (distortion) during the modulation unless there is no significant energy in the modulating signal below the loop bandwidth.

Two point modulation schemes address signal loss or distortion due to loop filter effects. In a two point modulation system, the modulating signal may be applied to the loop at two places—both before and after the loop filter. Assuming the gains in these two modulation paths are matched, the low-pass response seen by the pre-loop filter connection and the high-pass response seen by the post loop filter connection cancel each other out with the result being that the loop has a flat frequency response (same gain over all frequencies) for the modulating signal, avoiding distortion in the modulation signal as it is modulated onto the carrier. However, when the gains are not matched, the low-pass and high-pass responses do not cancel each other out and some distortion occurs. To avoid loss or distortion of the modulating signal as it is modulated by the loop onto the carrier, the gains of the two modulation paths must be matched. Gain matching has been accomplished in a variety of ways.

One technique to match gains first requires testing of each device incorporating a PLL then the special manufacturing or physical modification of each PLL's loop filter resulting in a unique loop filter for every IC and PLL combination. The special manufacturing of loop filters is time consuming and very expensive.

In another technique, tuning has been accomplished by writing a value into non-volatile memory that sets the gain in the Vkmod path so that it matches the gain in the loop correction signal Vkvco path. The non-volatile memory technique was not satisfactory as it consumed large amounts of chip area on device ICs and was not capable of tuning multiple carrier frequencies or channels after the initial manufacturing of the device, and thus added great cost to device manufacturing. The non-volatile memory technique also added additional testing time in the factory for each and every device manufactured, not just a particular model, adding to manufacturing costs.

The loop filter modification technique and the non-volitile memory technique also were highly unsatisfactory in that the tuning was accomplished once at the factory for a single channel. This single channel tuning matches Vkvco and Vkmod gains for only a single channel since the gains vary for each channel. Thus, gain mismatch worsens when any channel besides the tuned channel is used resulting in varying degrees of distortion that limited the performance and capabilities of a given device.

Another tuning method added a second internal VCO and PLL which is used as a reference during power-up of the associated transmitter for each burst of transmitted data. The difference between Vkvco and Vkmod path gains is detected to determine a value that sets gain in the Vkmod path so that it matches gain in the Vkvco path. The duplication of the PLL also consumed large areas of device ICs, was not useful in portable devices due to undesirable power consumption requirements and was much more complex and costly to manufacture.

Accordingly, it would be advantageous to have a method and apparatus for tuning the gain of the Vkvco and Vkmod signal paths with lower power consumption, fewer components and a simplified and time efficient tuning arrangement.

BRIEF SUMMARY OF THE INVENTION

The invention presents a method and apparatus for tuning a two-point modulated phase-locked loop (PLL) such as may be used for modulated signal transmission in a communication system. The present invention provides tuning of a PLL for single or multiple carrier frequency channels with gain correction of an applied modulation signal. The Vkvco loop correction signal is sampled and held after applying a +1 modulation signal to the modulation input and then sampled with a −1 modulation signal applied to the modulation input. The sampled Vkvco values are compared to produce a gain correction signal which is scaled onto a modulation signal thereby producing a gain corrected modulation input signal Vkmod to the VCO. The gain through the two modulation paths to the VCO is matched using the correction signal to minimize distortion of the VCO output.

For a multiple channel transmission system, this method can be applied independently for each channel. Vkvco signals can be sampled for each channel to produce an associated gain correction signal for each channel.

These and other features and advantages of the invention will be better understood by reference to the detailed description below which is provided in conjunction with the accompanying drawings.

DETAILED DESCRIPTION OF THE INVENTION

Figure 1:
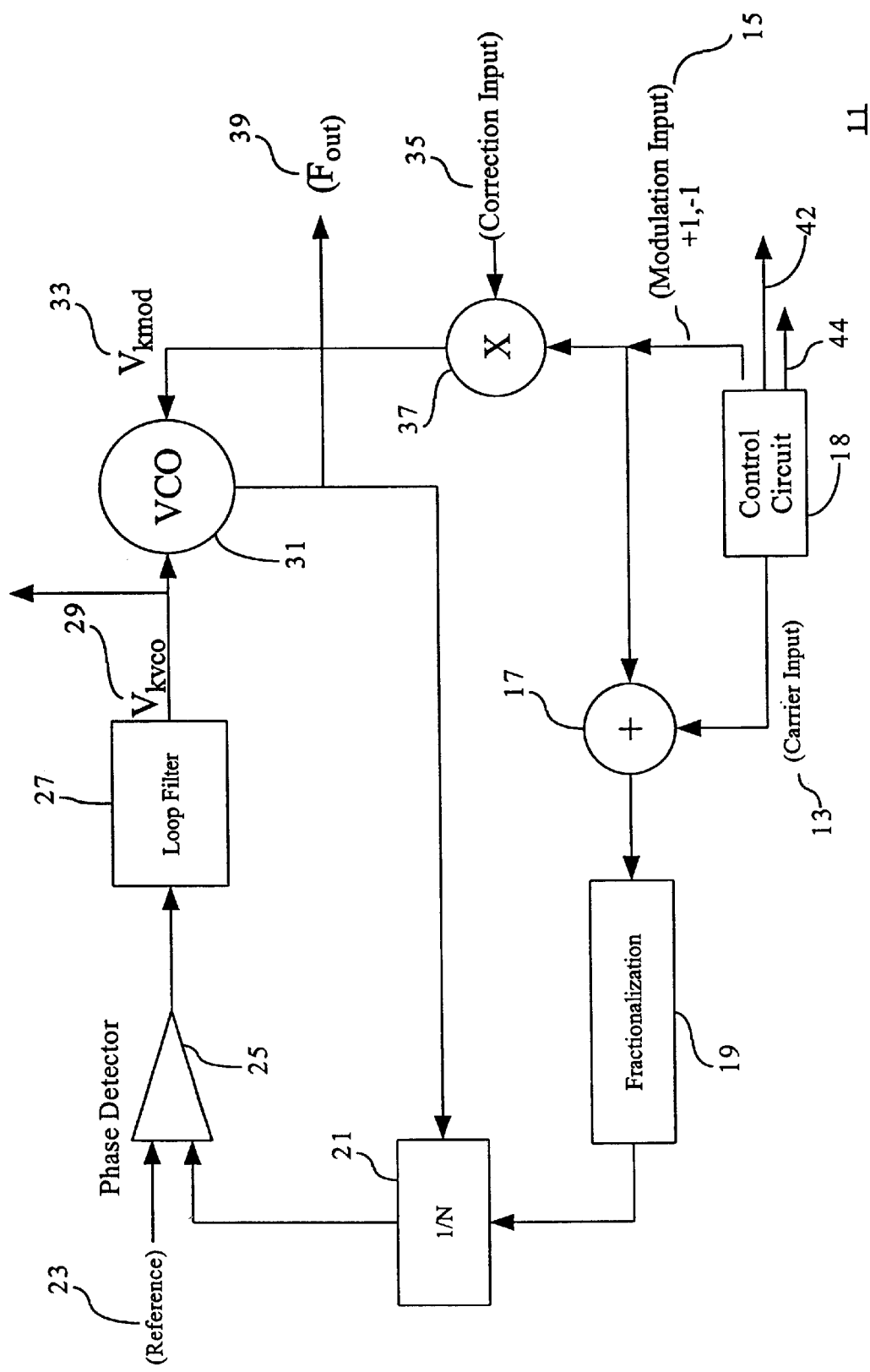
FIG. 1 is a block diagram of an exemplary PLL modulation system which may employ the invention.

Referring to the drawings, FIG. 1 illustrates a PLL system for use in binary frequency shift keying (BFSK) scheme modulating a carrier signal to produce a modulated output signal Fout. The carrier center frequency is set by the VCO and frequency modulation of this carrier occurs in response to a signal applied to a modulation input terminal 15. The PLL includes a phase detector 25, loop filter 27, a VCO 31 for receiving the loop correction modulating signal Vkvco 29 and a gain corrected modulation signal input Vkmod 33 and providing the output signal Fout, and a frequency divider 21 for dividing by the Fout signal by a scalable factor N which is then applied to phase detector 25 which also receives a reference signal 23. A scaling circuit 37 is provided which receives a gain correction input signal 35 which is used to scale the gain of the modulation signal 15 input into the scaling circuit 37 thereby producing a gain corrected modulation input signal Vkmod 33 for input to the VCO 31.

A carrier channel input 13 is provided which is used to program divider 21 to divide the Fout signal by an appropriate factor N for a given channel carrier frequency to produce a loop frequency which is input to phase detector 25 for comparison with reference frequency signal 23. The carrier channel input 13 is provided by a control circuit 18. The carrier channel input 13 is a number of a digital value which is used to determine the base carrier frequency in the Fout signal. For example, if the center frequency of Fout is to be 100 Mhz and the reference signal 23 is 10 Mhz, then the carrier channel input value would be the digital value corresponding to 11. The carrier channel input is also adjusted by the value of the applied modulation input 15 with an adder 17. Alternatively the modulation input to the adder 17 can also be accomplished using a scaler which serves as a frequency deviation input for +1 and −1 deviation which would scale a +1 to a number representing a desired positive deviation in frequency and −1 to a number representing a desired negative deviation in frequency.

A fractionalization circuit 19 produces an average value of the carrier channel input as adjusted by the modulation input 15. The N in the frequency divider 21 is obtained from the fractionalization circuit 19 output to create the desired average loop frequency value that is input into the phase detector 25. Note that in this example, N does not equal carrier+modulation. Channel selection circuitry can incorporate a circuit which derives a sequence of divisor factors such that the average of said sequence of divisor factors is equal to the sum of the received signals.

For Binary Frequency Shift Keying (BFSK) modulation, the modulation input 15 can take on values of +1 or −1. When the carrier input 13 is set at a channel c1 and the modulation input 15 is set at 0, the loop will settle to Fout=Fc1 and the loop correction signal Vkvco 29 will settle to a voltage value of Vc1. When the modulation input is 15 changed to +1, the loop will settle out to Fout=Fc1+Δ, where Δ is the frequency deviation due to +1 modulation. If the gains in the Vkvco 29 and Vkmod 33 path are matched, the loop correction signal Vkvco 29 will again settle to Vc1. If the Vkvco and Vkmod signal path gains are mismatched, the loop correction signal Vkvco 29 will settle to a voltage value of Vc1+ϵ, where ϵ represents the voltage offset due to gain mismatch. When the modulation input 15 is changed to −1, the loop will settle out to Fout=Fc1−Δ and again the correction signal Vkvco 29 will settle to Vc1 if the Vkvco and Vkmod signal path gains are matched. If the Vkvco and Vkmod signal path gains are mismatched the voltage Vkvco 29 will settle to Vc1−γ. If the varacter characteristic within VCO 31 is linear, ϵ=γ. The present invention seeks to make ϵ and γ approximate a value of zero by tuning the correction input 35 so that the gain from the modulation input 15 to Fout 39 through Vkmod 33 is matched to the gain from the modulation input 15 to Fout 39 through Vkvco 29. It should be noted that the +1 indicates a positive deviation in frequency and the −1 indicates a negative deviation in frequency. Alternatively, a scaler can be placed prior to adder 17 that would scale a +1 to a number representing a desired positive deviation in frequency and −1 to a number representing a desired negative deviation in frequency. The coefficient for the scaling could be supplied by the control circuit 18 or by another control component. The control circuit 18 can be the same component supplying carrier input 13 and modulation input 15 or alternatively separate components such as in FIG. 5 and control circuit 18'.

Figure 2:
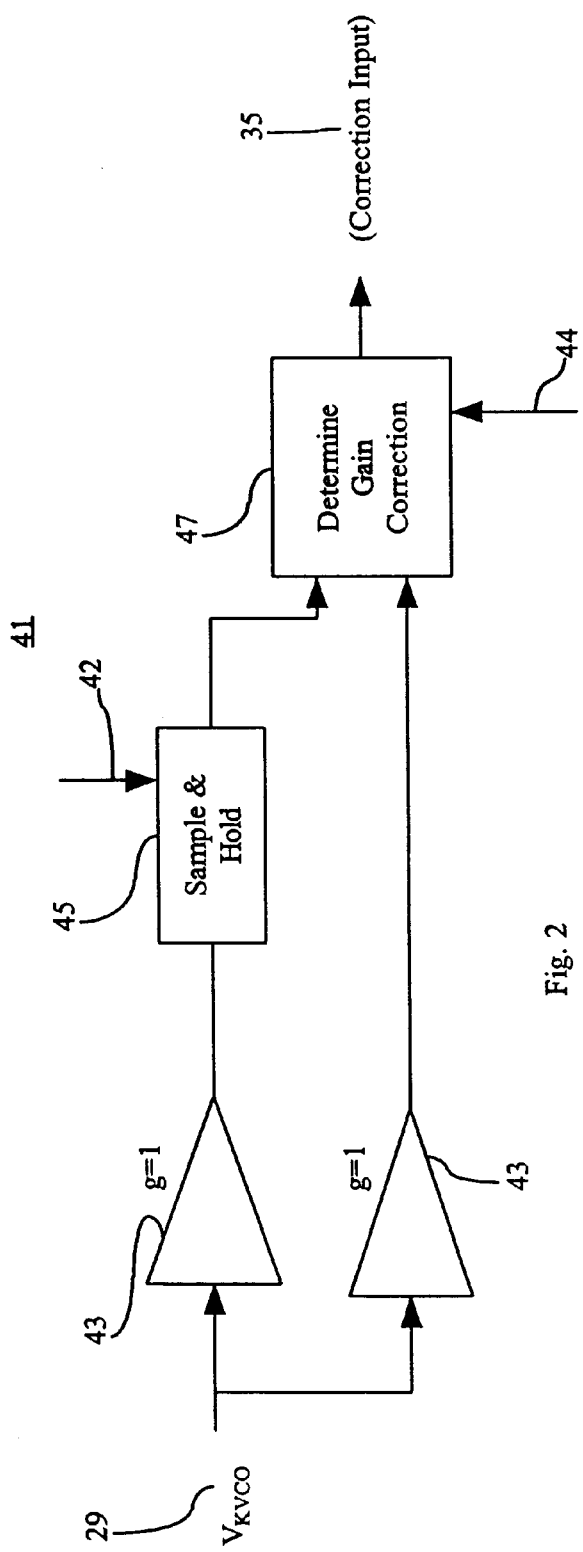
FIG. 2 is a block diagram of a gain correction circuit which may be used with the FIG. 1 circuit.

Turning to FIG. 2, a comparator circuit is provided for comparing the loop correction signal Vkvco 29 when the modulation input is +1 to the correction signal Vkvco 29 when the modulation input is −1 during a correction period which precedes actual use of the FIG. 1 PLL for signal modulation. Using the compare results, a determine gain correction circuit 47 can then determine a gain correction signal input 35 which is used to scale a modulation input 15 to produce a gain corrected modulation signal input Vkmod 33 during subsequent operation of the PLL so that the Vkvco and Vkmod signal gains match) thereby eliminating the ϵ and γ error or gain mismatch.

The FIG. 2 circuit has unity gain amplifiers 43 receiving a correction signal Vkvco 29, taken from the FIG. 1 circuit, then inputting the amplified Vkvco signal to a sample and hold circuit 45 and to the determine gain correction circuit 47. The sample and hold circuit 45 is used to sample and hold a Vkvco signal value when one modulation value, e.g., +1 is generated. This value is held for comparison in the determine gain correction circuit 47 with a value of Vkvco produced when the other modulation value, e.g., −1, is used. The difference represents the differences in gain of the Vkmod and Vkvco signals and is used to develop a proportional gain correction signal 35 to reduce the difference to zero. The correction factor is applied as a gain correction signal input 35 to the scaling circuit 37 in FIG. 1 to scale the gain of a modulation signal 15 to produce a gain corrected modulation signal input Vkmod 33 which is input to the FIG. 1 VCO 31.

The FIG. 2 circuit may determine the gain correction input signal 35 from one comparison of the Vkvco signal values for +1 and −1 modulation inputs or successive Vkvco signal comparisons can be employed to produce the gain correction input signal 35.

Figure 3:
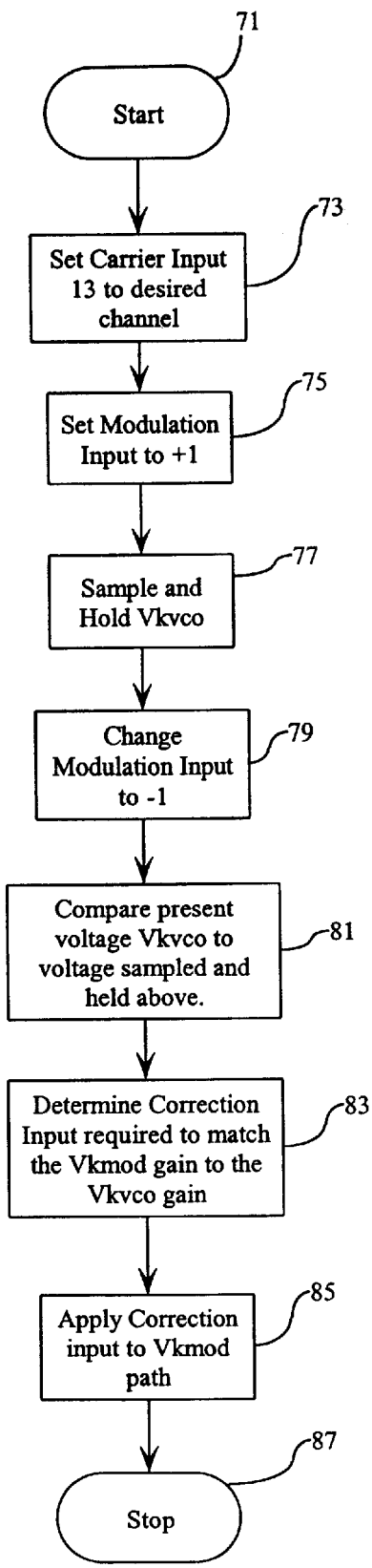
FIG. 3 is a process sequence for balancing the Vkvco and Vkmod signal gains using the FIG. 1 and FIG. 2 circuits.

FIG. 3 discloses one processing sequence that may be used with the FIG. 1 and FIG. 2 circuits in which a single comparative measurement of the Vkvco signal 29 values is used to develop the gain correction input signal 35. Control circuit 18 (FIG. 1), which can be a logic circuit, microprocessor or any other type of control circuit, implements the process of FIG. 3. It starts the PLL tuning cycle at processing segment 71 and sets the carrier input 13 to a desired channel at processing segment 73. The control circuit 18 will then set a modulation input 15 of +1 at processing segment 75, and will then allow the PLL to settle. The control circuit 18 will then operate sample and hold circuit 45, causing it to store the Vkvco correction signal 29 at processing segment 77. Next, the control circuit 18 will set the modulation input 15 to −1 and again allow the PLL to settle at processing segment 79. The control circuit 18 at processing segment 81 operates the determine gain correction circuit 41 causing it to compare the Vkvco signals 29 corresponding to the −1 and +1 modulation inputs, the latter being stored in the sample and hold circuit 45, and the former being taken directly from the PLL loop, and develops a gain correction input signal 35 from the difference between the two compared Vkvco values which is required to match the Vkmod gain to the Vkvco gain that is, to produce a difference in the compared Vkvco signals of zero. The gain correction input signal 35 is developed at processing segment 83 and is applied to scaling circuit 37 to appropriately scale the modulation input 15 in the Vkmod path at processing segment 85 for subsequent operation of the PLL.

It should be noted that the FIG. 3 sequence can be repeated each time a channel is changed so that an appropriate gain correction input signal 35 is set for a corresponding selected channel.

Figure 4:
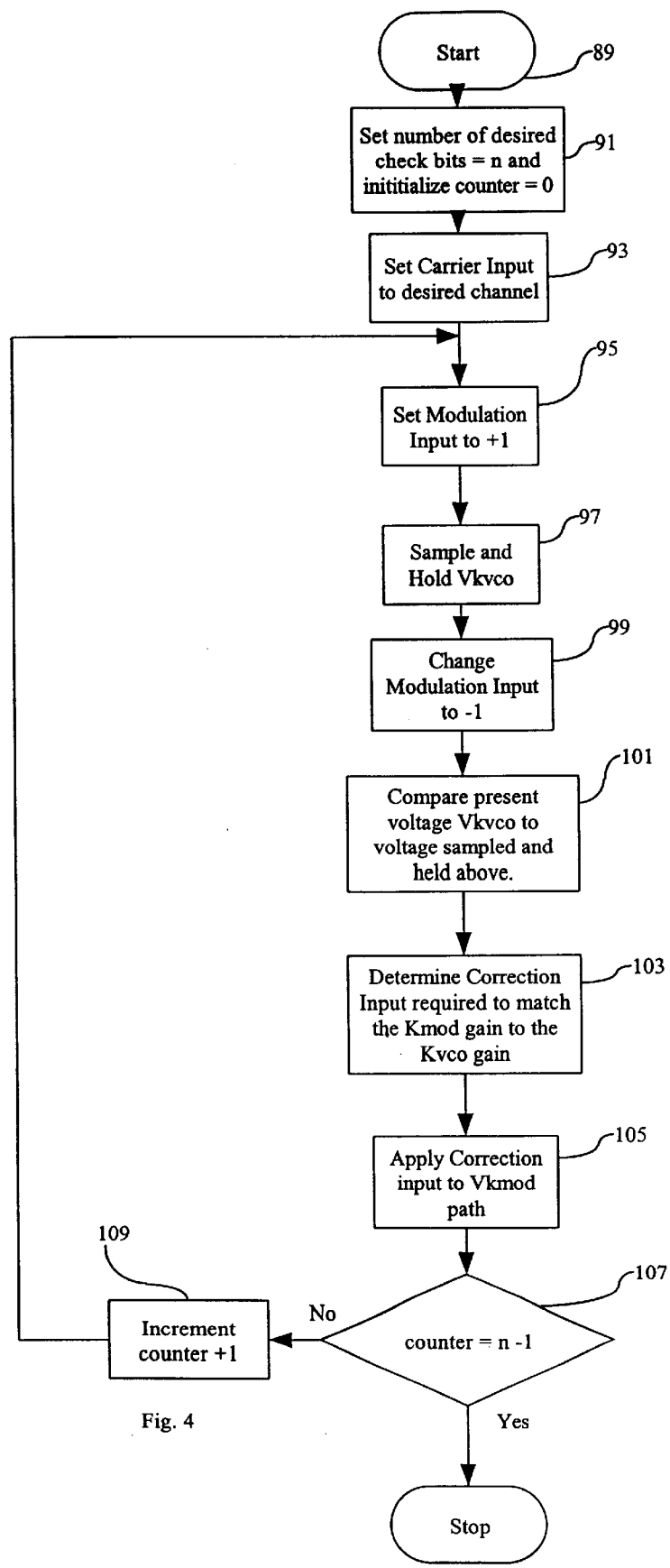
FIG. 4 discloses an alternative processing sequence which may be used for gain balancing.

The FIG. 3 processing sequence is but one way to develop a gain correction input signal 35. In another processing sequence shown in FIG. 4, a three-step approach is shown. Again, this sequence can be implemented by control circuit 18. The processing sequence is started at processing segment 89. At processing segment 91, a number of check bits n will be set and a counter will be initialized to zero. In this example using a three step approach, n will equal 3. The carrier channel input 13 is set to a desired channel by control circuit 18 at processing segment 93 and the modulation input 15 is set to +1 at processing segment 95 then the PLL will be allowed to settle. The control circuit 18 will then operate sample and hold circuit 45 to store the Vkvco signal 29 at processing segment 97. Next, control circuit 18 will set the modulation input 15 to −1 at processing segment 99 and then the PLL will be allowed to settle. The control circuit 18 will then operate the determine gain correction circuit 47 so that it compares the Vkvco signals for the +1 and −1 modulation inputs to develop a gain correction input signal 35 required to match the Vkmod gain to the Vkvco gain 103. The gain correction input signal 35 is applied to scaling circuit 37 in the Vkmod signal path at processing segment 105. The control circuit 18 will then determine if the counter, which currently stores a value of 0, equals n−1 at processing segment 107. For this first iteration, where n=3 and the counter=0, processing segment 107 will yield a "no" response, in which case the counter value will be incremented by one in processing segment 109 and the processing sequence is repeated from segments 95 through 107. A new gain correction input signal 35 is thus developed each time the sequence is repeated and each time the correction input value is refined. If the counter =n−1, as determined in processing segment 107, then the successive measurement and correction loop processing sequence will be terminated. Thus, if the counter value does not equal n−1, then the counter value will be incremented by one in processing segment 109 and the processing scheme will repeat until the counter holds a value of 2 which equals n−1, as determined in step 107. The final gain correction input signal 35 is applied to scaling circuit 37 where it is used to scale the gain of subsequent modulation inputs to the PLL in the Vkmod path thereby producing a gain corrected modulation input 33 for input into the VCO 31. The FIG. 4 sequence permits an appropriate gain correction input signal 35 to be developed and modified in three stages, thereby minimizing possibility of a signal aberration which might occur using only one set of Vkvco samples.

Although the FIG. 1 and FIG. 2 circuits are shown as utilizing primarily analog circuits, the invention may also be implemented using analog or digital circuits or a combination of analog and digital circuits.

Figure 5:
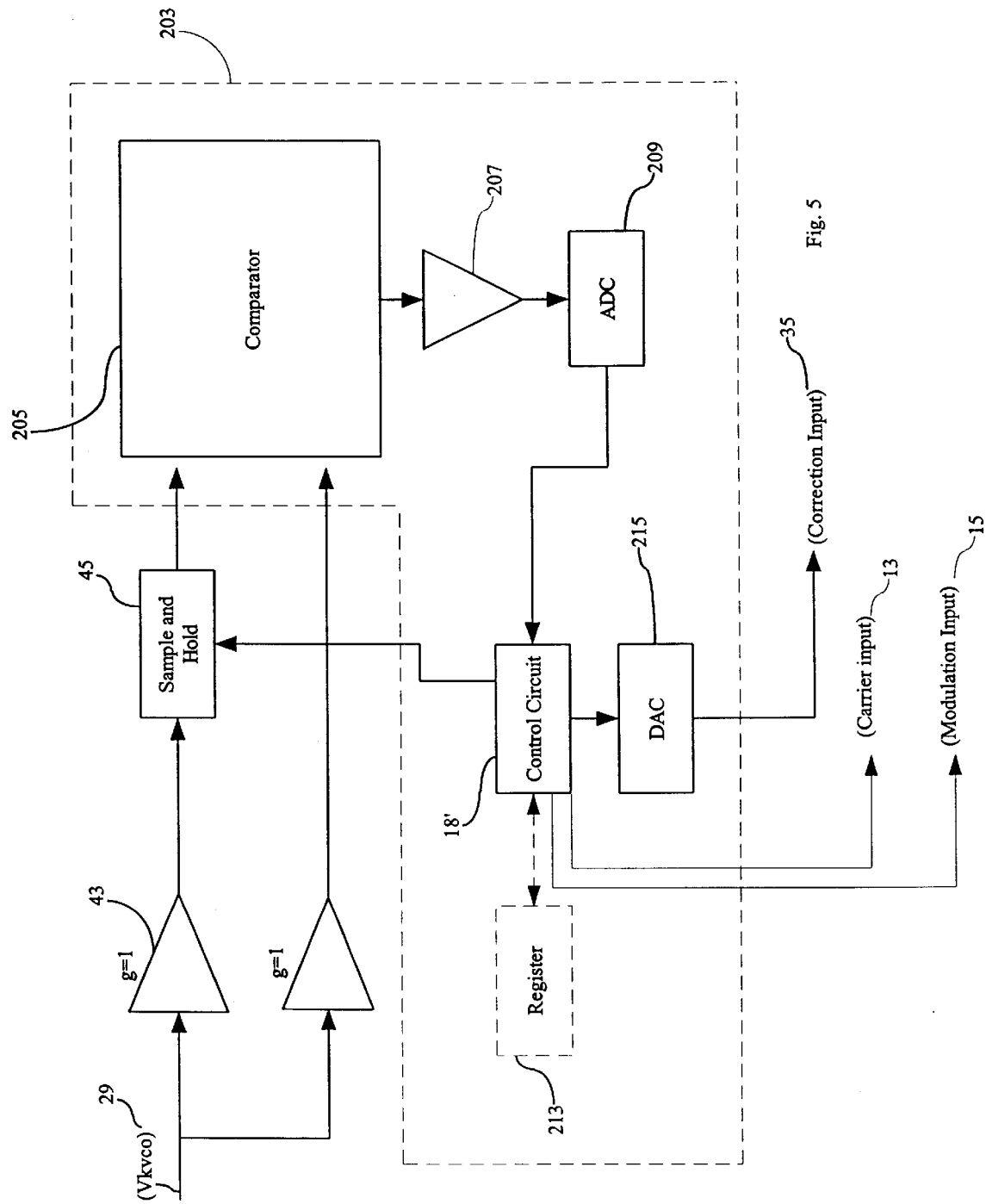
FIG. 5 is a block diagram of an alternative structure which may be used for gain balancing.

Turning to FIG. 5, another embodiment of the invention is shown which uses a digital circuit to compare the voltage Vkvco obtained when the modulation input is +1 to the voltage Vkvco obtained when the modulation input is −1. The circuit determines a gain correction input signal 35 to scale a modulation input 15 in the scaling circuit 37 to produce a gain corrected modulation signal input Vkmod 33 so that the Vkvco and Vkmod gains match.

The FIG. 5 circuit employs a pair of unity gain amplifiers 43, a sample and hold circuit 45 for sampling and holding a Vkvco value when one modulation value, e.g., +1 is generated. This value is then compared in a digital gain correction circuit 203 with a value of Vkvco produced when the other modulation value, e.g., −1, is used. The differences represent the differences in gain of the Vkmod and Vkvco signals which is used to develop a proportional correction factor to reduce the difference to zero. The correction factor is applied as a gain correction input signal 35 to the scaling circuit 37 in the FIG. 1 circuit.

The digital gain correction circuit 203 includes an analog comparator 205 to compare analog values of the +1 modulation Vkvco signal from the sample and hold circuit 45 to the −1 modulation Vkvco signal. The result of the comparison is sent to an amplifier 207 and then to an analog-to-digital converter (ADC) 209. The ADC output signal is then sent to control circuit 18' which controls the production of the gain correction input signal 35. The control circuit 18' evaluates the Vkvco difference signal and develops a digital correction signal which is applied to a digital to analog circuit (DAC) 215 which converts the digital signal to an analog correction signal which is output as the gain correction input signal 35. In this embodiment, control circuit 18' develops a three bit digital value used for the gain correction value and which is applied to DAC 215. It should be noted that the control circuit 18' illustrated in FIG. 5 replaces the control circuit 18 shown in FIG. 1.

Figure 6:
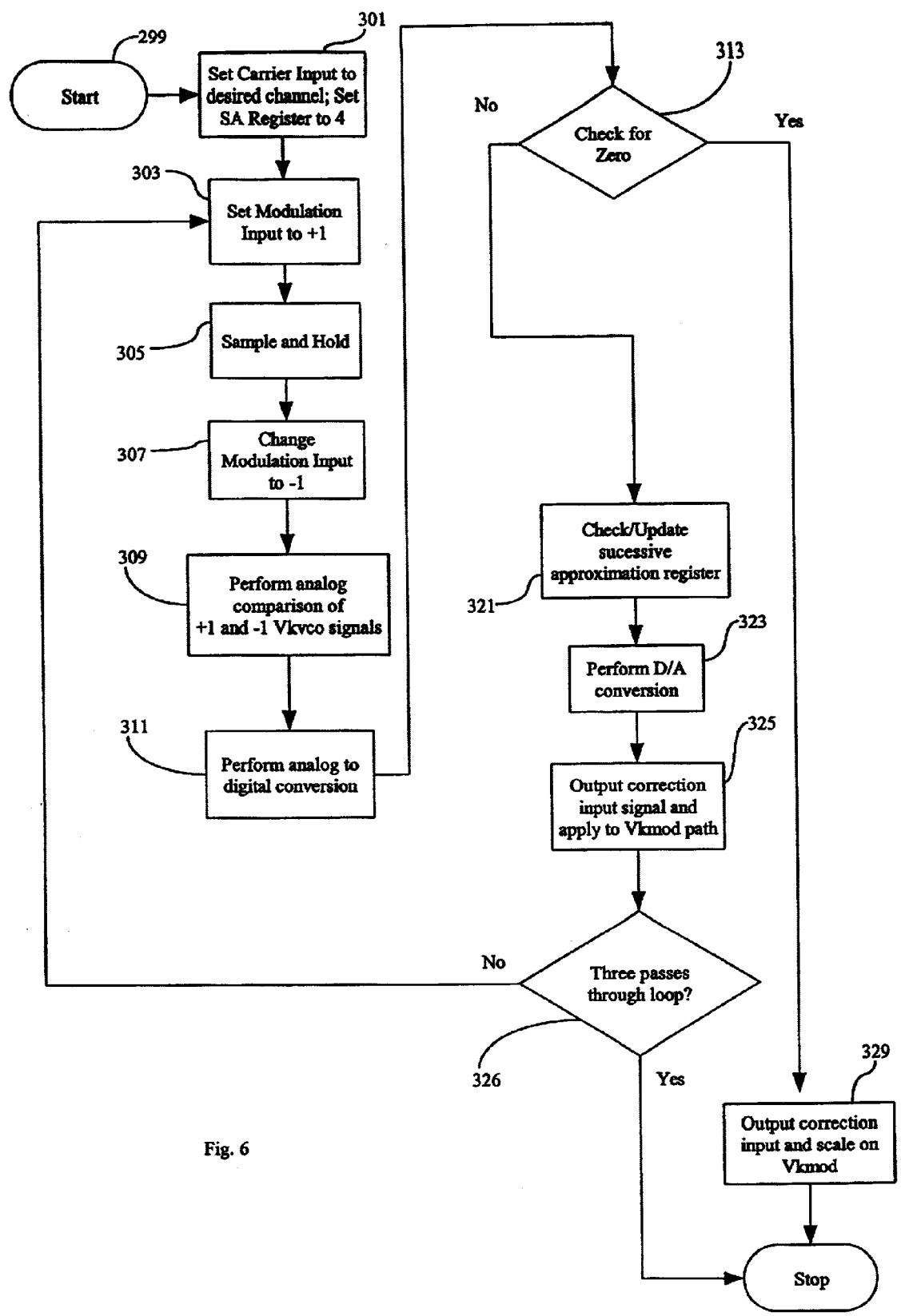
FIG. 6 is a process sequence for balancing gain using the FIG. 1 and FIG. 5 circuits.

A register 213 may also be used with control circuit 18' to develop the gain correction input signal 35 using a successive approximation technique. FIG. 6 discloses a processing sequence which may be used with the FIG. 1 and FIG. 5 circuits using a successive approximation technique to develop the gain correction input signal 35. In this arrangement, the control circuit 18' controls the processing sequence shown in FIG. 6. Referring to FIG. 6, control circuit 18' (FIG. 5) will start the PLL tuning cycle at processing segment 299. A carrier channel input is set to a desired value by control circuit 18', for example 110 for a 100 Mhz carrier signal at processing segment 301. Control circuit 18' will also set the 3 bit successive approximation register 213 to an initial binary value of 100 at processing segment 301. Control circuit 18' at processing segment 303 will next set the modulation input 15 to a first value, e.g. +1, and the loop will be allowed to settle. The Vkvco signal will be sampled and held by a sample and hold circuit 45 at processing segment 305. The control circuit 18' will next change the modulation input to another value, e.g. −1 at processing segment 307. Next, the first Vkvco signal obtained with a +1 modulation input, which is stored in the sample and hold circuit 45, will be compared with the second Vkvco signal obtained with the −1 modulation input by the analog comparison circuit 205, and a signal will be output to amplifier 207 at processing segment 309. The comparison output signal will next be converted to a digital signal by a digital signal to analog converter 209 in processing segment 311.

The control circuit 18' examines the digital comparison signal at processing segment 313. If the comparison signal indicates a zero difference at segment 313, then the successive approximation register values are not modified and a gain correction input signal 35, based on the value in the successive approximation register 213, is generated by control circuit 18' and the analog output thereof is applied as the gain correction input signal 35 to scaling circuit 37 in FIG. 1 (segment 329). If the comparison signal is not zero, then the control circuit 18' determines if the register value should be higher or lower than a binary value of 100 (the current value in the register 213) in processing segment 313. If the Vkvco comparison indicates the register value should be lower, then the control circuit 18' decrements the MSB value by setting it to zero and the next lower MSB (here the middle bit position) is selected and set to 1 at processing segment 321. If the comparison of the two Vkvco values indicate the need for higher gain in the Vkmod path, or in other words a higher correction register value, the MSB is left alone (the MSB value of 1 is retained), and the next lower MSB is set to 1 at processing segment 321. Then the control circuit 18' uses the register 213 value to produce a digital correction signal which is converted back to an analog signal by DAC 215 at processing segment 323 and applied as an analog gain correction input signal 35 to scaling circuit 37 at processing segment 325.

At processing segment 326 control circuit 18' checks to see if there have been three passes through the processing sequence. If so, the processing sequence ends. If not, the processing sequence from segments 303 to 326 is repeated again.

Thus, the control circuit 18' again sets the modulation to a first value, e.g. +1 (segment 303), and a Vkvco signal is stored by the sample and hold circuit 45 after the PLL settles (segment 305). The control circuit 18' then sets the modulation input to a second value, e.g. −1 (segment 307), and a second Vkvco signal (−1) is acquired. Next, the first and second Vkvco (+1 and −1) signals are compared by the analog comparator 205 (segment 309) which generates a comparison signal which is digitized by ADC 209 (segment 311) and the result is checked by control circuit 18' for a zero value (segment 313). If the value is zero, then the correction signal 35 is output and scaled onto the Vkmod path 33. If the value is not zero, the digital comparison signal is checked by the control circuit 18' to see if the digital value stored in the successive approximation register 213 should be higher or lower than its current value (segment 321). If the digital comparison signal indicates the register value should be lower, then the middle bit (in this 3 bit successive approximation register embodiment) is selected, set to zero and the least significant bit is set to one (segment 321). The digital correction input signal corresponding to the contents of register 213 is then generated by control circuit 18' and converted back to analog form by DAC 215 for use by scaling circuit 37. If the digital comparison value indicates that the value in the successive approximation register 213 should be higher than the current value, then the middle bit is left alone (i.e., a "1" value) and the least significant bit is set to 1. Once again, control circuit 18' checks to see if there have been three passes through the FIG. 6 sequence. If so, the processing sequence ends and the correction input value is not further modified until the tuning cycle is again triggered by the control circuit 18'. If not, control circuit 18' causes the process from segments 303 to 326 to repeat again. In the last pass through the sequence, the control circuit 18' will compare the digital difference between the Vkvco (+1) and Vkvco (−1) signals and determine if the value stored in the successive approximation register should be higher or lower. If the value should be higher, then the least significant bit is left alone. If the value should be lower, then the least significant bit is set to zero. When process segment 326 is reached on the third pass through the FIG. 6 sequence, the process is terminated and control circuit 18' uses the then stored value in register 213 as the digital correction value which is passed to DAC 215 which produces gain correction input signal 35.

The digital value of one bit of the successive approximation register 213 will thus be determined at each iteration of the process sequence of FIG. 6 until the least significant bit is determined and the successive approximation register 213 contains a final value which is used as the final gain correction input signal 35 to scale the applied modulation signal in scaling circuit 37.

Figure 7:
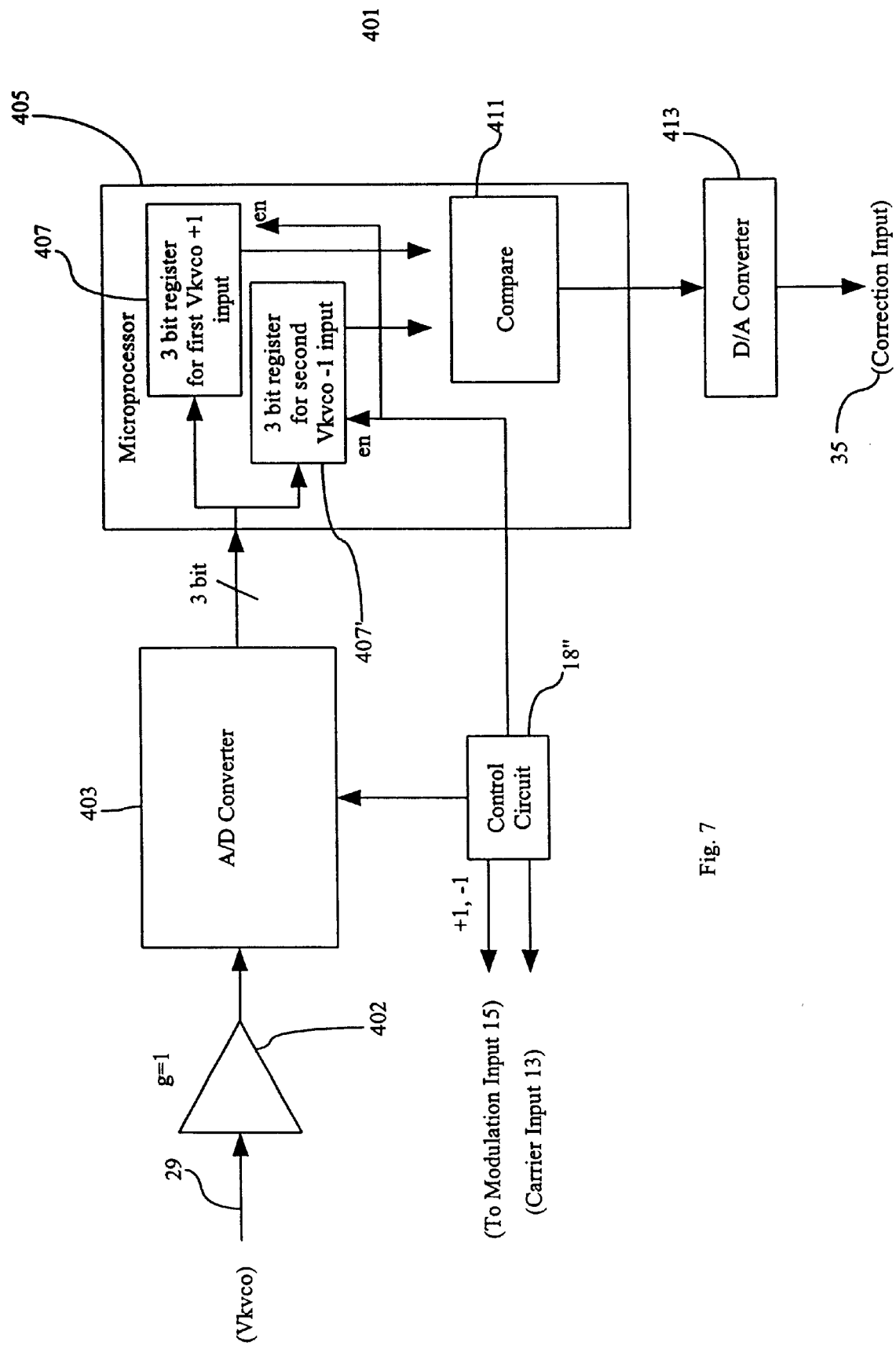
FIG. 7 is a block diagram of another alternative structure which may be used for gain balancing.

FIG. 7 discloses yet another arrangement for generating the gain correction input signal 35 to scaling circuit 37. This embodiment uses a unity gain amplifier 402 and an analog to digital converter (ADC) 403 which respectively amplify and convert an input analog Vkvco signal 29 to digital form. A carrier channel value 13 is set in the FIG. 1 system, and control circuit 18" inputs a first modulation value, e.g. +1 into the FIG. 1 system which, after the PLL settles, produces a first correction voltage Vkvco (+1). The Vkvco (+1) signal is then converted to a 3 bit digital value by the ADC 403 which is stored in a 3 bit storage register 407. Next, the control circuit 18" inputs a second modulation value, e.g. −1, which, after the PLL settles, is converted to a digital value Vkvco (−1) by the ADC 403 which is stored in a 3 bit storage register 407'. The first (+1) and second (−1) Vkvco signals are then compared by digital comparator 411, which produces a digital correction signal which is converted back to analog form by the digital to analog converter (DAC) 413. The output of DAC 413 is the gain correction input signal 35 which is applied to scaling circuit 37 to scale a modulation input 15 in the Vkmod path to produce the applied gain corrected modulation input signal Vkmod 33 signal during subsequent operation of the PLL.

Figure 8:
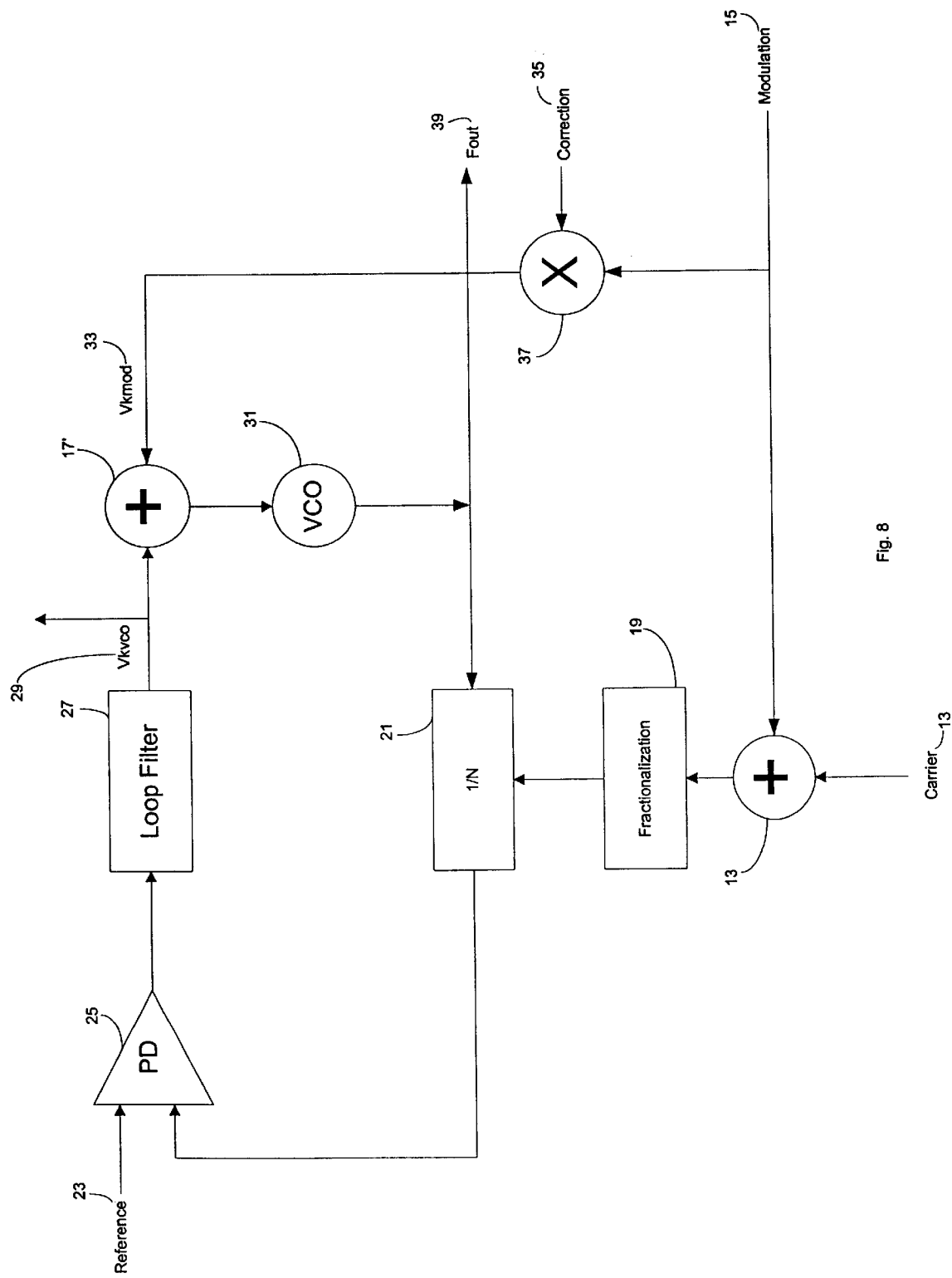
FIG. 8 is a block diagram of another alternative structure which may be used for gain balancing.

FIG. 8 discloses another two point modulation system for the PLL which may be used in the invention. In this arrangement, the modulation signal Vkmod 33 is added to the correction signal Vkvco 29 and the combined signal is used to modulate VCO 31.

Figure 9:
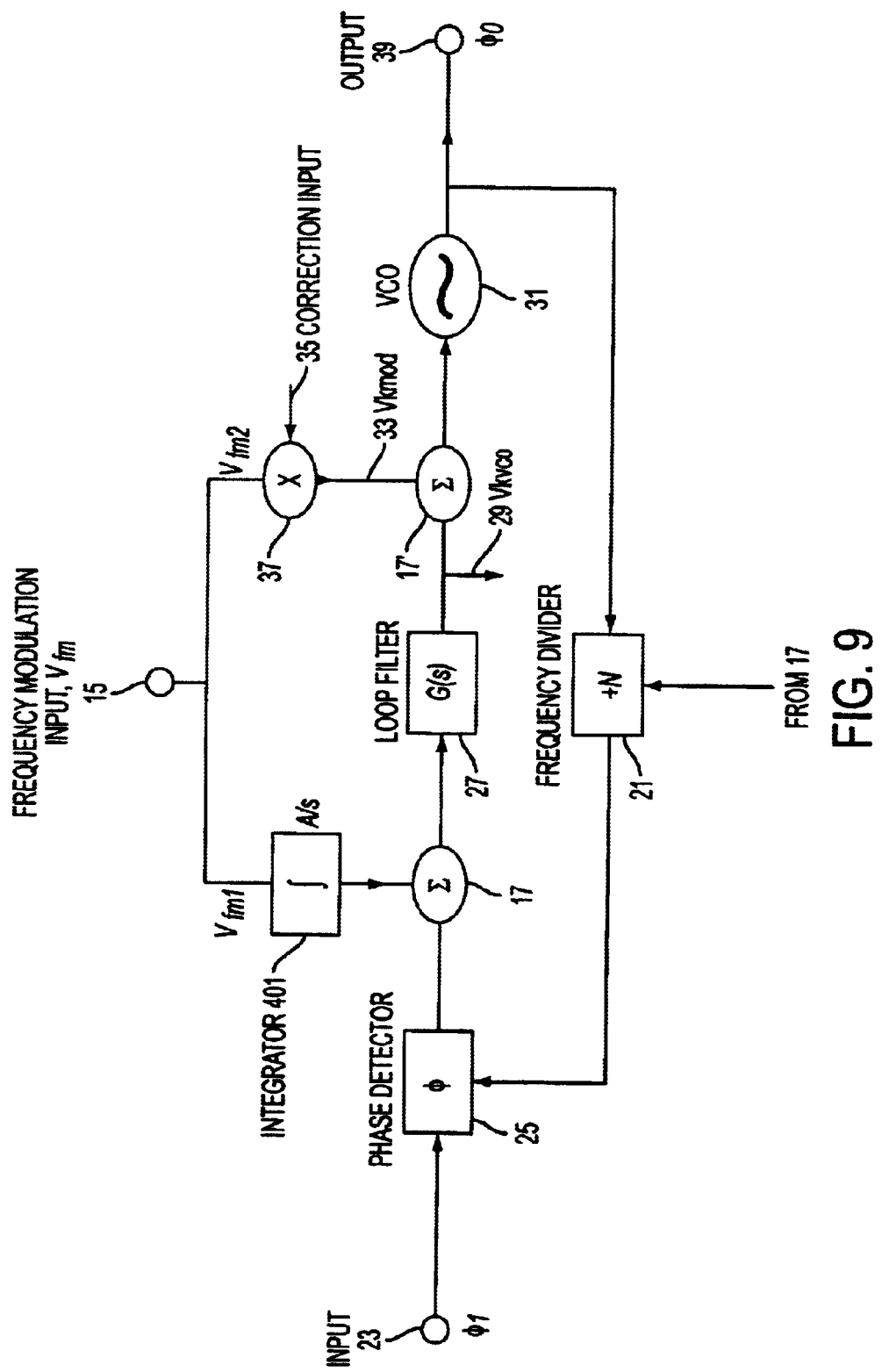
FIG. 9 is a block diagram of another alternative structure which may be used for gain balancing.

FIG. 9 discloses yet another two point modulation scheme for the PLL which may be used with the invention. The primary difference between this embodiment and the embodiment in FIG. 1 is the application of the modulation signal Vfm to the system as the signal $Vfm_1$ at an additive point 17 before the loop filter 27 through an integrator 401 and the application of the modulation signal Vfm as the signal $Vfm_2$ to an additive point 17' downstream of the loop filter Vkvco 29 signal. The modulation signal $Vfm_2$ is scaled in scaling circuit 37 by the correction input. The scaling circuit 37 scales the modulation input signal $Vfm_2$ to produce the gain corrected modulation input Vkmod 33.

As illustrated by the various disclosed embodiments, the present invention may employ analog, digital or a combination of analog and digital circuits to modulate and correct the modulated VCO output of a PLL. Also, control circuits 18, 18', 18" have been described which may also be implemented as analog, digital or a combination of analog and digital circuits. Also, various two point modulation schemes may be used with the invention to produce the desired gain matching. Thus, while exemplary embodiments of the invention have been described and illustrated, the present invention is not to be considered as limited by such description and illustration, but is only limited by the scope of the appended claims.

What is claimed as new and desired to be protected by Letters Patent of the United States is:

1. A modulation system comprising:
   a phase lock loop comprising a voltage controlled oscillator which is responsive to two signals which affect an output from said voltage controlled oscillator; one signal comprising a loop correction signal and the other signal comprising a gain corrected modulation input signal; and
   a modulation gain correction circuit comprising a comparator for comparing first and second filtered signals developed by the phase lock loop in response to respective first and second modulation inputs and developing a gain correction signal from the comparison, said gain correction signal being used to scale an applied input modulation signal to produce the gain corrected modulation input signal.

2. A system of claim 1 wherein said phase lock loop further comprises a summing circuit for summing said loop correction signal and said gain corrected modulation input signal, said summing circuit having an output signal which is applied to an input to said voltage controlled oscillator.

3. A system as in claim 1 wherein said phase lock loop further comprises
   a phase detector for detecting a phase or frequency difference between a reference signal and a signal derived from the output of said voltage controlled oscillator;
   a first summing circuit for summing an output of said phase detector with an applied uncorrected modulation input signal;
   a loop filter connected to an output of said first summing circuit;
   a second summing circuit for summing an output of said loop filter with said corrected modulation input signal; and
   an input of said voltage controlled oscillator being connected to an output of said second summing circuit.

4. A system as in claim 3 further comprising an integrator for applying said uncorrected modulation input signal to said first summing circuit.

5. A system as in claim 1 wherein said voltage controlled oscillator has two inputs, one receiving said loop correction signal and the other receiving said gain corrected modulation input signal.

6. A modulation system comprising:
   a phase lock loop comprising:
      a phase detector having first and second input, said first input for receiving a reference signal;
      a loop filter coupled to an output of the phase detector;
      a voltage controlled oscillator coupled to receive a loop correction output signal of said loop filter and a scaled input modulation signal, said voltage controlled oscillator providing a modulated output signal;
      a frequency divider for dividing the output of said voltage controlled oscillator and providing a frequency divided output to said second input of said phase detector;
   a scaling circuit for scaling an applied input modulation signal in accordance with a gain correction signal to provide said scaled input modulation signal; and
   a gain correction circuit, said gain correction circuit produces said gain correction signal based on a comparison of a loop correction output signal produced when said voltage controlled oscillator receives an unscaled first level modulation signal with a loop correction output signal produced when said voltage controlled oscillator receives an unscaled second level modulation signal.

7. A system as in claim 6 wherein said loop correction output signal and said scaled input modulation signal are applied to respective inputs of said voltage controlled oscillator.

8. A system as in claim 6 further comprising a summing circuit for summing said loop correction output signal and said scaled input modulation signal and applying a resulting summed signal to an input of said voltage controlled oscillator.

9. A system as in claim 6 further comprising:
   a first summing circuit provided between an output of said phase detector and input of said loop filter for summing the output of said phase detector with a signal derived from said applied input modulation signal and applying a resulting summed signal to the input of said loop filter; and
   a second summing circuit provided between an output of said loop filter and an input to said voltage controlled oscillator for summing the output of said loop filter with said scaled input modulation signal and applying the summed result to an input of said voltage controlled oscillator.

10. A system as in claim 9 further comprising an integrator circuit which receives said applied input modulation signal and provides said derived signal.

11. A system as in claim 6 wherein said loop correction output signal is taken at the output of said loop filter.

12. A system as in claim 6 wherein said modulation system is a BPSK modulation system, and said first and second level modulation signals are respectively +1 and −1.

13. A system as in claim 12 wherein said applied input modulation signal has the values of +1 and −1.

14. A system as in claim 6 wherein said gain correction circuit provides said gain correction signal based on a plurality of said comparisons.

15. A system as in claim 14 wherein said gain correction circuit uses said plurality of comparisons in a successive approximation technique to produce said gain correction signal.

16. A system as in claim 6 wherein said frequency divider is programmable, said system further comprising a channel selecting circuit for selecting a nominal operating frequency for said voltage controlled oscillator, said channel selecting circuit providing a divisor factor to said frequency divider in accordance with a selected channel.

17. A system as in claim 16, wherein said channel selecting circuit receives a carrier signal corresponding to the selected channel and said applied input modulation signal and sums the received signals and derives said divisor factor from the summed result.

18. A system as in claim 17 wherein said channel selecting circuit further comprises a circuit which derives a sequence of said divisor factors such that an average of said sequence of divisor factors is equal to the sum of the received signals.

19. A system as in claim 18 wherein said averaging circuit is a fractionalization circuit.

20. A modulation method comprising:
applying a loop correction signal and a scaled modulation input signal to a voltage controlled oscillator of a phase lock loop circuit to produce a modulated output signal from said voltage controlled oscillator;
producing a scaling factor by operating said loop circuit and comparing respective loop correction signals which are produced when unscaled modulation input signals of first and second levels are applied to said voltage oscillator, said scaling factor being based on the result of said comparison; and
applying said scaling factor to an applied input modulation signal to provide said scaled modulation input signal.

21. A method as in claim 20 further comprising applying said loop correction signal and said scaled input modulation signal to respective inputs of said voltage controlled oscillator.

22. A method as in claim 20 further comprising summing said loop correction signal and said scaled input modulation signal and applying the resultant summed signal to an input of said voltage controlled oscillator.

23. A method as in claim 20 wherein said phase lock loop further comprises a phase detector and a loop filter, said method further comprising:
summing an output of said phase detector with a signal derived from said applied input modulation signal and applying the resultant sum to an input of said loop filter;
summing an output of said loop filter with said scaled input modulation signal and applying the summed result to an input of said voltage controlled oscillator.

24. A method as in claim 23 further comprising integrating said applied input modulation signal to produce said derived signal.

25. A method as in claim 20 further comprising producing said scaling factor based on a plurality of said comparisons.

26. A method as in claim 25 wherein said scaling factor is produced using a successive approximation technique.

27. A modulation system comprising:
a phase lock loop comprising:
a phase detector having first and second input, said first input for receiving a reference signal;
a loop filter coupled to an output of the phase detector;
a voltage controlled oscillator coupled to receive a loop correction output signal of said loop filter and a scaled input modulation signal, said voltage controlled oscillator providing a modulated output signal;
a frequency divider for dividing the output of said voltage controlled oscillator and providing a frequency divided output to said second input of said phase detector;
a scaling circuit for scaling an applied input modulation signal in accordance with a gain correction signal to provide said scaled input modulation signal; and
a gain correction circuit for providing said gain correction signal, said gain correction circuit providing a gain correction signal based on a comparison of a first and second modulation of said loop correction output signal of said loop filter.

28. A system as in claim 27 further comprising a summing circuit for summing said loop correction output signal and said scaled input modulation signal and applying a resulting summed signal to an input of said voltage controlled oscillator.

29. A system as in claim 27 further comprising:
a first summing circuit provided between an output of said phase detector and input of said loop filter for summing the output of said phase detector with a signal derived from said applied input modulation signal and applying a resulting summed signal to the input of said loop filter; and
a second summing circuit provided between an output of said loop filter and an input to said voltage controlled oscillator for summing the output of said loop filter with said scaled input modulation signal and applying the summed result to an input of said voltage controlled oscillator.

30. A modulation system comprising:
a phase lock loop comprising:
a phase detector having first and second input, said first input for receiving a reference signal;
a loop filter couple to an output of the phase detector;
a voltage controlled oscillator coupled to receive a loop correction output signal of said loop filter and a control input modulation signal, said voltage controlled oscillator providing a modulated output signal;
a frequency divider adapted to divide the output of said voltage controlled oscillator and providing a frequency divided output to said second input of said phase detector;
a circuit for modulating an applied input modulation signal in accordance with a gain correction signal o provide said control input modulation signal; and
a gain correction circuit, said gain correction circuit producing said gain correction signal based on a comparison of signals comprising a first and second signal, said first signal being produced when said voltage controlled oscillator receives an unscaled first level modulation signal and said second signal being produced when said voltage controlled oscillator receives an unscaled second level modulation signal.

31. A system as in claim 30, wherein said gain correction circuit provides said gain correction signal based on a plurality of said comparisons.

32. A system as in claim 31, wherein said gain correction circuit uses said plurality of comparisons in a successive approximation technique to produce said gain correction signal.

33. A system as in claim 30, wherein said gain correction circuit comprises at least one sample an hold circuit.

34. A system as in claim 30, wherein said gain correction circuit comprises a portion adapted to calculate a gain correction based on said first and second signal.

35. A system as in claim 30, wherein said loop correction output signal and said control input modulation signal are applied to respective inputs of said voltage controlled oscillator.

36. A system in claim 30 further comprising:
a first summing circuit provided between an output of said phase detector and input of said loop filter for summing the output of said phase detector with a signal derived from said applied input modulation signal and applying a resulting summed signal to the input of said loop filter; and
a second summing circuit provided between an output of said loop filter and an input to said voltage controlled oscillator for summing the output of said loop filter with said control input modulation signal and applying the summed result to an input of said voltage controlled oscillator.

37. A system as in claim 30, wherein said frequency divider is programmable, said system further comprising a channel selecting circuit for selecting an optimal operating frequency for said voltage controlled oscillator, said channel selecting circuit providing a divisor factor to said frequency divider in accordance with a selected channel.

38. A system as in claim 37, wherein said channel selecting circuit receives a carrier signal corresponding to the selected channel and said applied input modulation signal and sums the received signals and derives said divisor factor from the summed result.

39. A system as in claim 38, wherein said channel selecting circuit farther comprises a circuit which derives a sequence of said divisor factors such that an average of said sequence of divisor factors is equal to the sum of the received signals.

* * * * *